(12) United States Patent
Brain

(10) Patent No.: US 10,177,020 B2
(45) Date of Patent: Jan. 8, 2019

(54) SYSTEM AND METHOD FOR HIGH THROUGHPUT WORK-IN-PROCESS BUFFER

(71) Applicant: KLA-Tencor Corporation, Milpitas, CA (US)

(72) Inventor: Michael D. Brain, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 251 days.

(21) Appl. No.: 15/016,635

(22) Filed: Feb. 5, 2016

(65) Prior Publication Data

US 2016/0233120 A1 Aug. 11, 2016

Related U.S. Application Data

(60) Provisional application No. 62/113,376, filed on Feb. 7, 2015.

(51) Int. Cl.
*H01L 21/677* (2006.01)
*B65G 1/02* (2006.01)

(52) U.S. Cl.
CPC .. *H01L 21/67736* (2013.01); *H01L 21/67706* (2013.01); *H01L 21/67715* (2013.01); *H01L 21/67769* (2013.01); *H01L 21/67775* (2013.01); *B65G 1/026* (2013.01)

(58) Field of Classification Search
CPC ......... H01L 21/67775; H01L 21/67733; H01L 21/6773; H01L 21/67718; H01L 21/67706; H01L 21/67736; H01L 21/67742; H01L 21/67769; H01L 21/67715; H01L 21/67727; B65G 2201/0297; B65G 1/026; B65G 1/0464; B65G 47/52; B65G 47/901

See application file for complete search history.

(56) References Cited

U.S. PATENT DOCUMENTS 4,636,128 A 1/1987 Millis et al.
5,967,740 A 10/1999 Pflueger et al.
(Continued)

FOREIGN PATENT DOCUMENTS

FR 2987610 A1 * 9/2013 ............... B65G 1/02
JP 2007096140 A * 4/2007 ............. B65G 1/026

OTHER PUBLICATIONS

PCT Search Report for PCT/US2016/016917 dated Jun. 29, 2016, 4 pages.

*Primary Examiner* — Glenn F Myers
(74) *Attorney, Agent, or Firm* — Suiter Swantz pc llo

(57) ABSTRACT

A buffer system for a semiconductor device fabrication tool includes one or more retractable shelves, one or more sliding assemblies positionable above the one or more load ports of the semiconductor device fabrication tool, and one or more lifting assemblies. The one or more retractable shelves are configured to support sealable containers. The one or more sliding assemblies are configured to receive the sealable containers and are further configured to transport the sealable containers to one or more positions beneath the one or more retractable shelves. The one or more lifting assemblies are configured to transport the sealable containers between any two of the group including one or more retractable shelves, the one or more sliding assemblies, and the one or more load ports.

36 Claims, 16 Drawing Sheets

(56) References Cited

U.S. PATENT DOCUMENTS

| | | | |
|---|---|---|---|
| 6,364,593 B1 * | 4/2002 | Hofmeister | H01L 21/67772 414/217.1 |
| 6,435,330 B1 | 8/2002 | Bonora et al. | |
| 6,582,174 B1 | 6/2003 | Hayashi | |
| 6,726,429 B2 | 4/2004 | Sackett et al. | |
| 6,856,847 B2 | 2/2005 | Kao et al. | |
| 7,100,340 B2 | 9/2006 | Bonora et al. | |
| 7,578,650 B2 | 8/2009 | Aalund et al. | |
| 8,196,732 B2 | 6/2012 | Fatula, Jr. et al. | |
| 8,197,172 B2 | 6/2012 | Doherty et al. | |
| 8,204,617 B2 | 6/2012 | Teferra et al. | |
| 8,229,587 B2 | 7/2012 | Shieh et al. | |
| 8,672,605 B2 | 3/2014 | van der Meulen et al. | |
| 8,678,734 B2 | 3/2014 | Friedman et al. | |
| 8,881,297 B2 * | 11/2014 | Gonzalez | G06F 21/44 726/26 |
| 8,882,433 B2 * | 11/2014 | Bonora | H01L 21/67766 414/331.03 |
| 2003/0156928 A1 * | 8/2003 | Sackett | H01L 21/67769 414/217 |
| 2004/0049398 A1 | 3/2004 | Gartland et al. | |
| 2008/0075564 A1 | 3/2008 | Tachibana | |
| 2009/0114507 A1 * | 5/2009 | Kitazumi | B65G 15/14 198/370.09 |
| 2009/0185151 A1 | 7/2009 | Yamamoto et al. | |
| 2010/0003111 A1 * | 1/2010 | Yeo | H01L 21/67769 414/222.07 |
| 2010/0047045 A1 | 2/2010 | Park et al. | |
| 2010/0080672 A1 | 4/2010 | Bonora et al. | |
| 2010/0278622 A1 | 11/2010 | Huang et al. | |
| 2010/0290873 A1 | 11/2010 | Bonora et al. | |
| 2013/0089396 A1 | 4/2013 | Bufano et al. | |
| 2014/0068753 A1 | 3/2014 | Gonzalez et al. | |
| 2015/0197412 A1 * | 7/2015 | Tomida | B66C 13/06 212/273 |

* cited by examiner

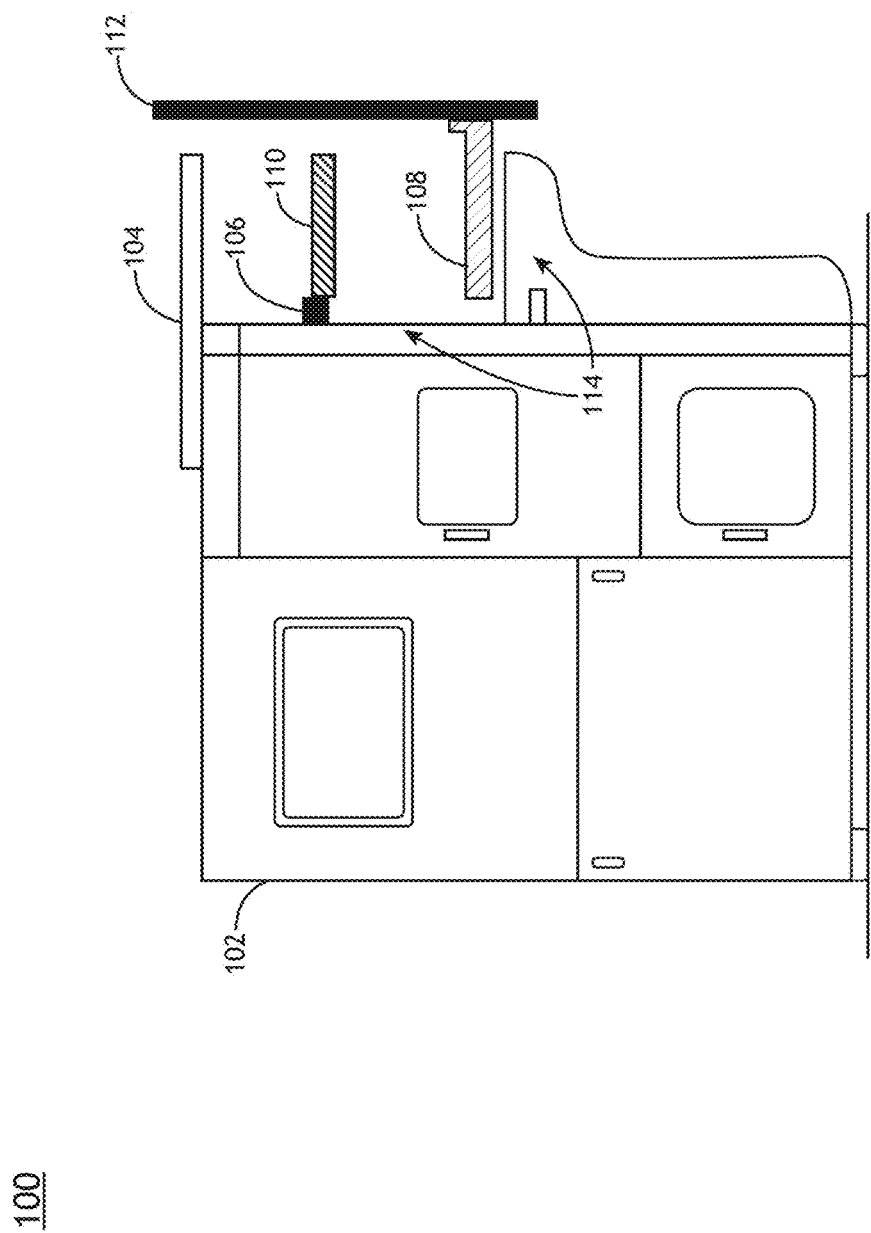

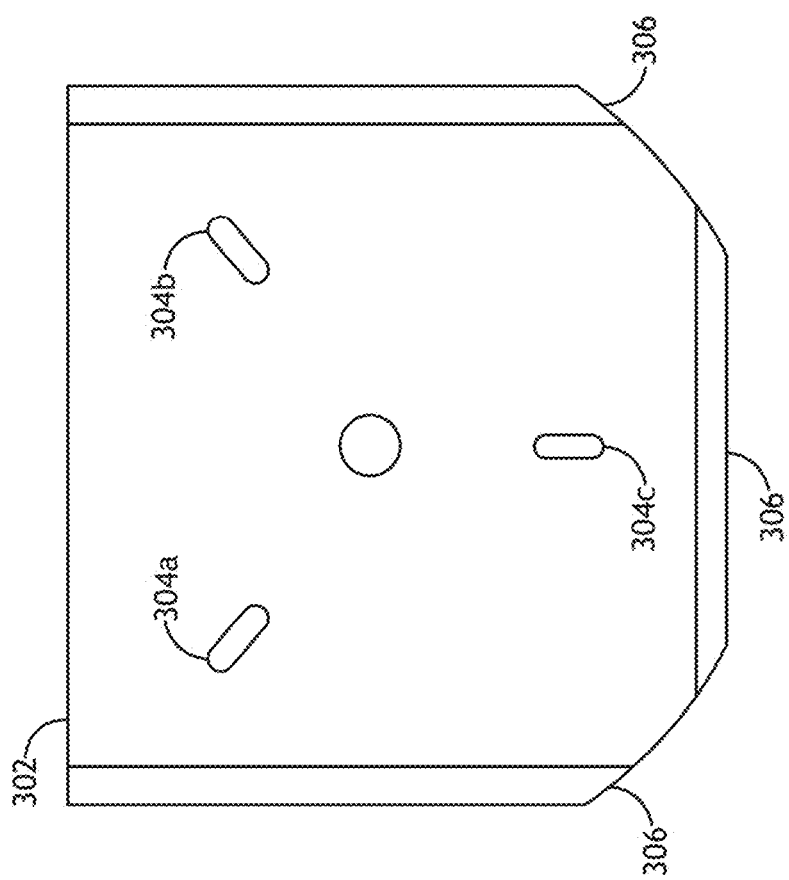

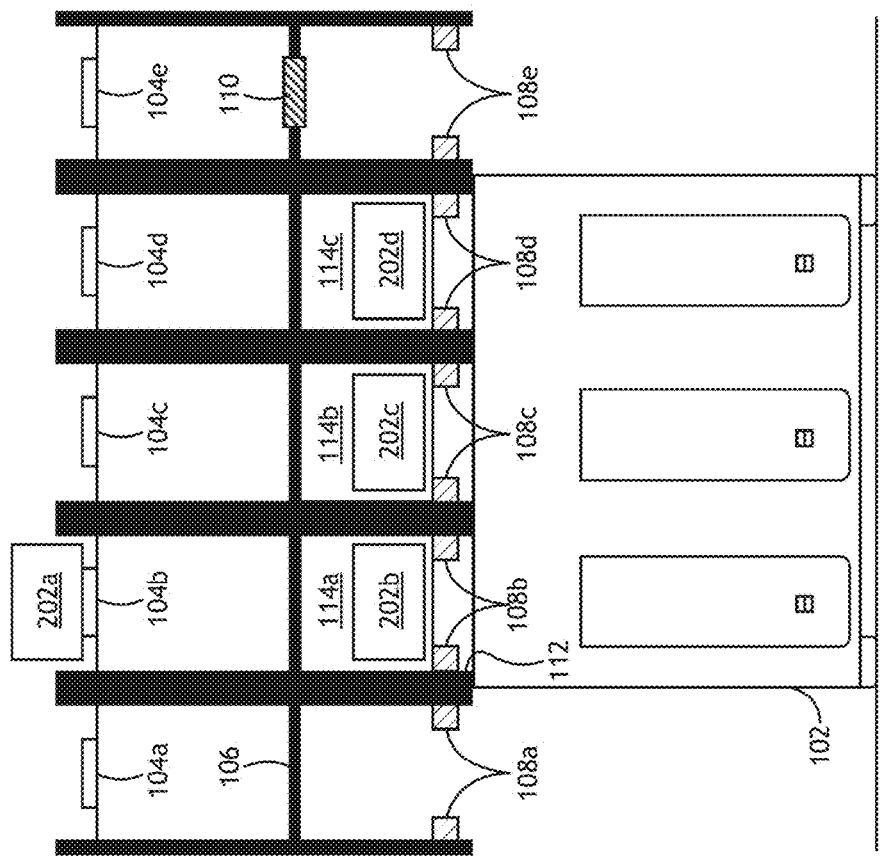

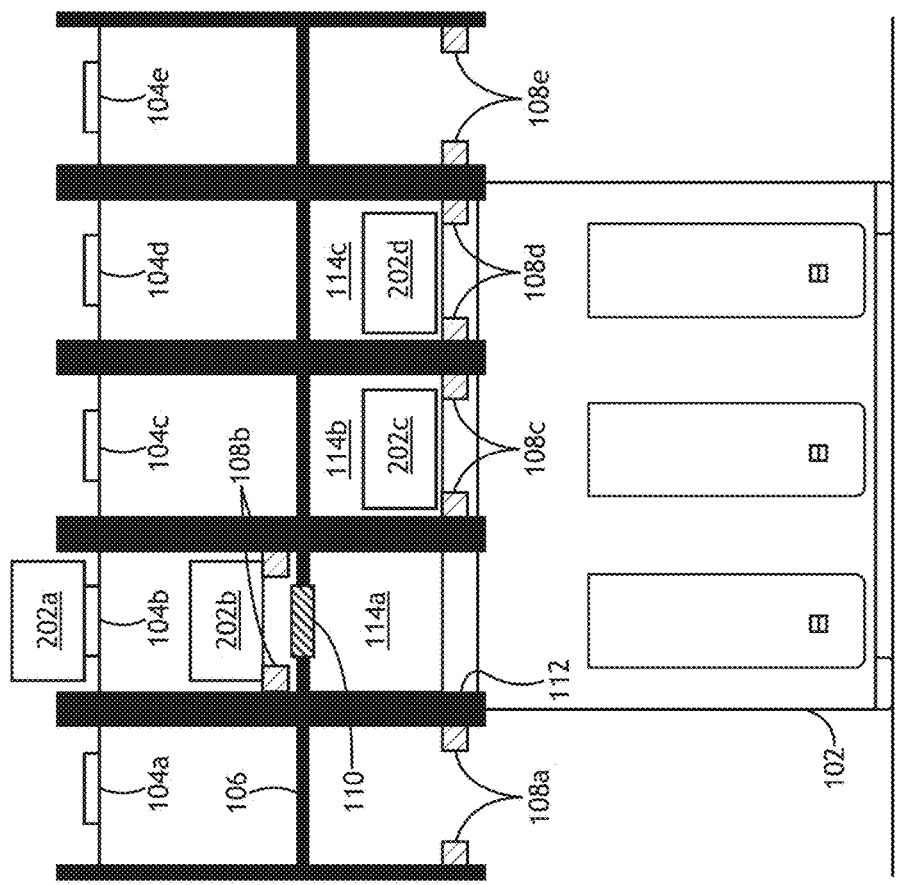

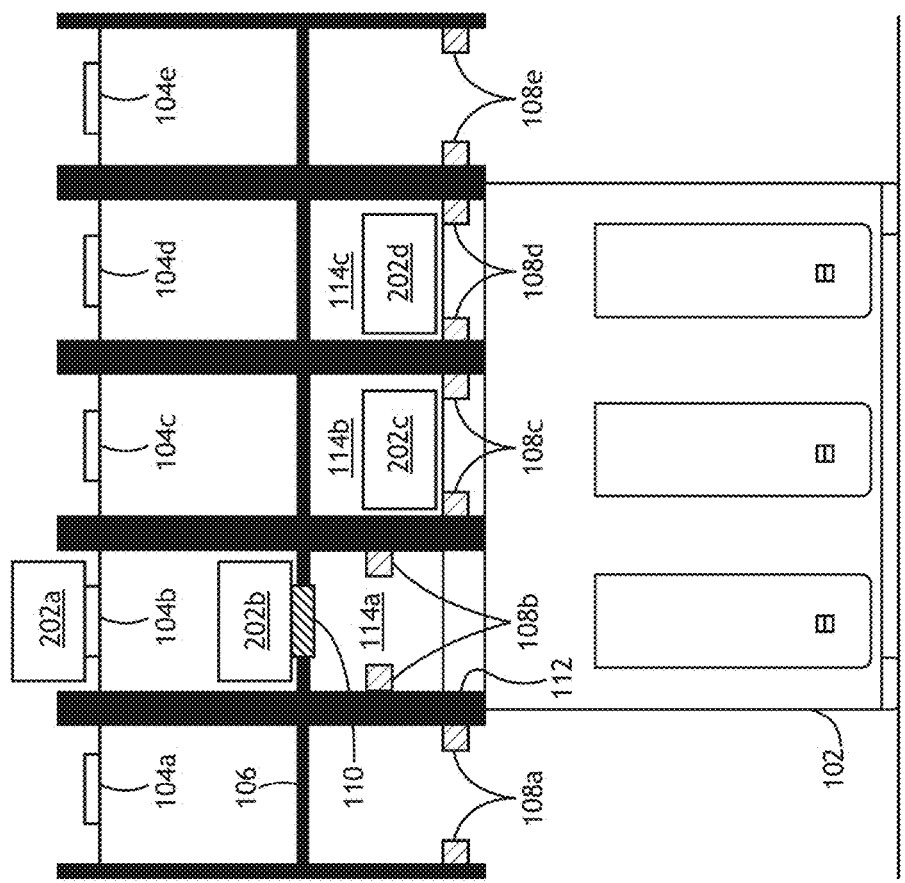

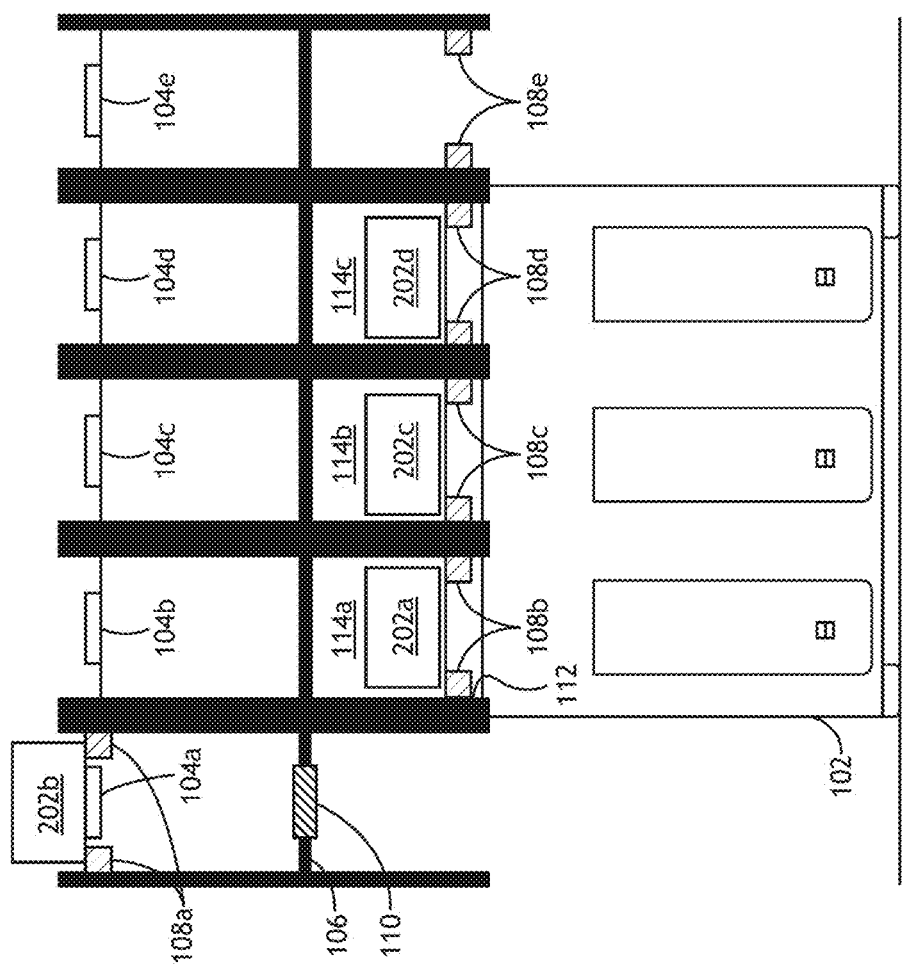

SYSTEM AND METHOD FOR HIGH THROUGHPUT WORK-IN-PROCESS BUFFER

CROSS-REFERENCE TO RELATED APPLICATION

The present application claims the benefit under 35 U.S.C. § 119(e) of U.S. Provisional Application Ser. No. 62/113,376, filed Feb. 7, 2015, entitled HIGH THROUGHPUT WORK IN PROCESS BUFFER, naming Michael Brain as inventor, which is incorporated herein by reference in the entirety.

TECHNICAL FIELD

The present disclosure relates generally to semiconductor device fabrication line tools, and more particularly, to high-throughput buffer systems for process flow management of semiconductor device fabrication line tools.

BACKGROUND

Process flows in modern semiconductor device fabrication lines utilize a multitude of fabrication steps performed by a series of semiconductor fabrication tools. In some cases, process flows may contain more than 800 process steps in a re-entrant flow among a set of semiconductor device fabrication line tools including over one thousand equipment units of over one hundred different types. Wafers in a process flow are typically moved through process steps in sealable containers, or front opening unified pods (FOUPs), by an automated material handling system (AMHS). Each semiconductor device fabrication line tool contains a standardized equipment front end module (EFEM), alternatively a load port, for receiving the sealable containers. Once a semiconductor device fabrication line tool has received a sealable container, the sealable container is opened in a controlled environment, processed, and returned to the FOUP for pickup by the AMHS. In this regard, the sealable container provides a clean and protective environment for the storage and transfer of wafers in a process flow.

It is generally desirable to reduce idle time, or starvation, of semiconductor device fabrication line tools associated with a deficiency of sealable containers available at the tool load port to be processed. However, the processing time of each semiconductor device fabrication line tool and the delivery time of sealable containers between semiconductor device fabrication line tools by the AMHS may vary, necessitating advanced process flow optimization systems. Typical semiconductor device fabrication line tools contain two to four load ports to serve as temporary storage for incoming or outgoing sealable containers. However, the additional load parts may not be sufficient to eliminate starvation, particularly for high throughput semiconductor device fabrication line tools. Further, practical considerations typically limit the number of load ports for a given semiconductor device fabrication line tool. For example, increasing the number of load ports consumes valuable space on a process line, increases travel requirements for wafer-handling systems (e.g. an AMHS), and increases the size of environmental enclosures surrounding the semiconductor device fabrication line tools, all of which increase operational expenses and increase maintenance requirements. Therefore, it would be desirable to provide a system and method for curing defects such as those identified above.

SUMMARY

A buffer system for a semiconductor device fabrication tool is disclosed, in accordance with one or more illustrative embodiments of the present disclosure. In one illustrative embodiment, the system includes one or more retractable shelves. In another illustrative embodiment, the one or more retractable shelves are configured to support sealable containers. In another illustrative embodiment, the system includes one or more sliding assemblies positionable above one or more load ports of the semiconductor device fabrication tool. In another illustrative embodiment, the one or more sliding assemblies are configured to transport the sealable containers to one or more positions beneath the one or more retractable shelves. In another illustrative embodiment, the system includes one or more lifting assemblies. In another illustrative embodiment, the one or more lifting assemblies are configured to transport the sealable containers between any two of the group including the one or more retractable shelves, the one or more sliding assemblies, and the one or more load ports.

A semiconductor device fabrication line tool is disclosed, in accordance with one or more illustrative embodiments of the present disclosure. In one illustrative embodiment, the semiconductor device fabrication line tool includes one or more load ports. In another illustrative embodiment, the semiconductor device fabrication line tool includes a buffer sub-system. In another illustrative embodiment, the buffer sub-system includes one or more retractable shelves. In another illustrative embodiment, the one or more retractable shelves are configured to support sealable containers. In another illustrative embodiment, the buffer sub-system includes one or more sliding assemblies positionable above the one or more load ports. In another illustrative embodiment, the one or more sliding assemblies are configured to transport the sealable containers to one or more positions beneath the one or more retractable shelves. In another illustrative embodiment, the buffer sub-system includes one or more lifting assemblies. In another illustrative embodiment, the one or more lifting assemblies are configured to transport the sealable containers between any two of the group including the one or more retractable shelves, the one or more sliding assemblies, and the one or more load ports.

A method for buffering a semiconductor device fabrication line tool is disclosed, in accordance with one or more illustrative embodiments of the present disclosure. In one illustrative embodiment, the method includes supporting one or more sealable containers on one or more retractable shelves. In another illustrative embodiment, the method includes transporting at least one of the one or more sealable containers to the one or more load ports. In another illustrative embodiment, at least one of the one or more retractable shelves retracts to provide clearance for the one or more sealable containers. In another illustrative embodiment, the method includes transporting the at least one of the one or more sealable containers to the at least one of the one or more retractable shelves.

It is to be understood that both the foregoing general description and the following detailed description are exemplary and explanatory only and are not necessarily restrictive of the present disclosure. The accompanying drawings, which are incorporated in and constitute a part of the characteristic, illustrate subject matter of the disclosure.

Together, the descriptions and the drawings serve to explain the principles of the disclosure.

BRIEF DESCRIPTION OF DRAWINGS

The numerous advantages of the disclosure may be better understood by those skilled in the art by reference to the accompanying figures in which:

FIG. 1B is a simplified side view of a high-throughput buffer system associated with a semiconductor device fabrication line tool, in accordance with one or more embodiments of the present disclosure.

FIG. 3 is a schematic view of a bottom side of a sealable container including kinematic pin slots, in accordance with one or more embodiments of the present disclosure.

FIG. 4A is a simplified front view of a high-throughput buffer system associated with a semiconductor device fabrication line tool illustrating a state in which three load ports are in use by sealable containers and a queued sealable container is supported on retractable shelf, in accordance with one or more embodiments of the present disclosure.

FIG. 4B is a simplified front view of a high-throughput buffer system associated with a semiconductor device fabrication line tool illustrating concurrent motion of a lifting assembly transporting a sealable container and a sliding assembly, in accordance with one or more embodiments of the present disclosure.

FIG. 4D is a simplified front view of a high-throughput buffer system associated with a semiconductor device fabrication line tool illustrating a lifting assembly disengaged from a sealable container located on a sliding assembly, in accordance with one or more embodiments of the present disclosure.

FIG. 4G is a simplified front view of a high-throughput buffer system associated with a semiconductor device fabrication line tool illustrating concurrent transfer of a first sealable container to a retractable shelf and a second concurrent container to a load port, in accordance with one or more embodiments of the present disclosure.

DETAILED DESCRIPTION

Figure 1A:
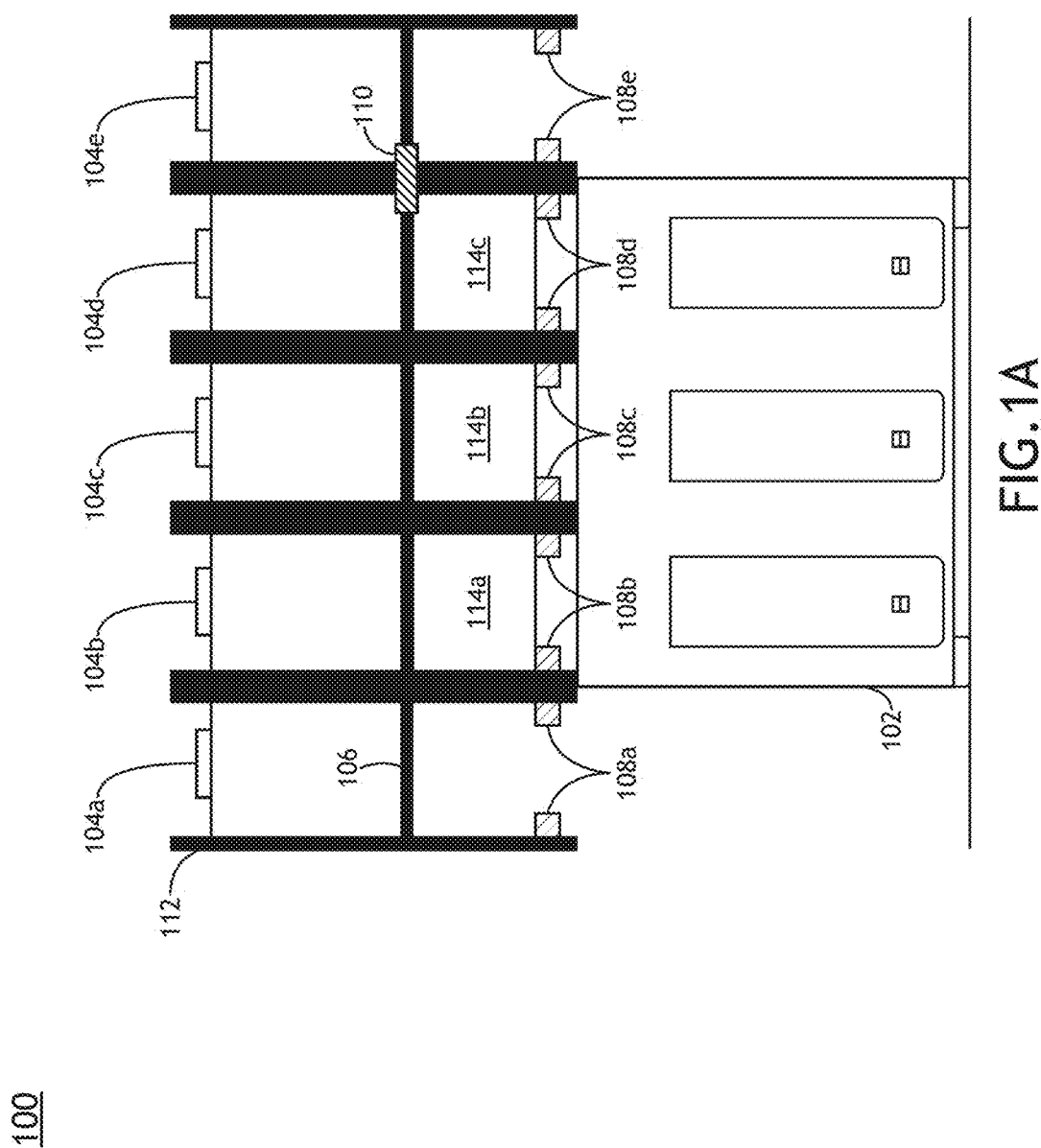
FIG. 1A is a simplified front view of a high-throughput buffer system associated with a semiconductor device fabrication line tool, in accordance with one or more embodiments of the present disclosure.

Reference will now be made in detail to the subject matter disclosed, which is illustrated in the accompanying drawings.

Referring generally to FIGS. 1A through 6, a system and method for providing a high-throughput buffer for a semiconductor device fabrication line tool is described, in accordance with one or more embodiments of the present disclosure. Embodiments of the present disclosure are directed to a buffer system associated with a semiconductor device fabrication tool containing retractable shelves. Additional embodiments are directed to a buffer system containing lifting and sliding assemblies to transport sealable containers between the retractable shelves and load ports of the semiconductor device fabrication line tool. Embodiments of the present disclosure provide for horizontal and vertical transport of sealable containers. In addition, embodiments of the present disclosure provide for efficient utilization of space surrounding a semiconductor device fabrication line tool, which, in turn, results in increased throughput of a process flow. It is noted herein that the terms sealable container and FOUP are used interchangeably for the purposes of the present disclosure.

It is recognized herein that throughput of a semiconductor device fabrication line tool is dependent on a multitude of factors including, but not limited to, the processing time of the tool, the number of load ports on the tool, the number of local storage locations for sealable containers including wafers to be processed, the transfer speed between the locally accessible storage locations and the load ports, and the delivery time of sealable containers to and from the tool. Certain factors such as, but not limited to, the number of local storage locations, and the transfer speed between the local storage locations and the load ports may be locally optimized for each semiconductor device fabrication line tool to reduce starvation of the tool and further to reduce the load on external transport systems such as an AMHS. In general, a system designed to interface between a semiconductor device fabrication line tool and an external handling system to mitigate starvation of the tool is referred to as a buffer system.

It is further recognized herein that the throughput of a semiconductor device fabrication line tool is additionally dependent on maintenance requirements associated with buffer system equipment. For example, certain equipment such as complex multi-axis robotic elements or ceiling-mounted transport systems may provide a certain level of performance when operational, but may suffer from relatively high maintenance requirements that necessitate temporary removal of the tool from a production line, thereby reducing total throughput. It is therefore desirable for a buffer system to provide a high level of operational reliability.

A buffer system with a quick swap buffer utilizing an overhead truck is generally described in U.S. Pat. No. 7,578,650, filed on Jul. 29, 2004, which is incorporated herein by reference in its entirety. A buffer system with vertically stacked storage is generally described in U.S. Pat. No. 6,726,429, filed on Feb. 19, 2002, which is incorporated herein by reference in its entirety.

FIGS. 1A-1D illustrate simplified schematic views of a high throughput buffer system 100 associated with a semiconductor device fabrication line tool, in accordance with one or more embodiments of the present disclosure. FIGS. 1A and 1B are simplified schematic views illustrating front and side views, respectively, of a high throughput buffer system, in accordance with one or more embodiments of the present disclosure. In one embodiment, a semiconductor device fabrication line tool 102 includes one or more load ports 114a-114c for receiving sealable containers. The contents of the sealable container on a load port are accessible to the semiconductor device fabrication line tool 102 for processing.

It is noted herein that the present disclosure is not limited to a particular number of load ports. For example, a buffer system 100 may be associated with a semiconductor device fabrication line tool 102 with a single load port, two load ports, or a multitude of load ports. Further, a buffer system 100 may be associated with a subset of the load ports available on a fabrication line tool 102. In one embodiment, a buffer system 100 is associated with a fabrication line tool that provides one load port open such that an external handling system may directly access the load port. Providing an external handling system direct access to one or more load ports may provide a failsafe such that the fabrication line tool may operate in a limited capacity in the event of a malfunction of the buffer system 100. In this regard, a buffer system 100 may be modular, using as many elevators and shelves as are needed to satisfy throughput requirements, servicing some or all of the tool load ports, and providing as many free load ports AMHS interface locations as needed. In another embodiment a buffer system 100 may be associated with more than one fabrication line tool 102.

In one embodiment, sealable containers managed by the buffer system 100 remain in a vertical plane oriented normal to a front side of the semiconductor device fabrication line tool 102. In this regard, transport of sealable containers is restricted to motion within the vertical plane. Limiting the motion of sealable containers within a vertical plane allows for efficient transport along linear paths. Further, limiting the motion of sealable containers to a vertical plane provides efficient utilization of floor space, which, in turn, reduces constraints on external equipment. For example, efficient utilization of floor space may reduce the length and duration of travel of external handling systems, reduce the size of environment enclosures surrounding semiconductor device fabrication tools 102, and/or reduce the load requirements of air handlers. It is noted herein, however, that restricting motion of sealable containers to a vertical plane is not a requirement of the present disclosure, and should not be interpreted as limiting.

In another embodiment, the buffer system 100 includes retractable shelves 104a-104e for supporting sealable containers. In another embodiment, sealable containers supported by the retractable shelves 104a-104e are accessible to an external handling system (not shown) such as, but not limited to, an AMHS. In this regard, retractable shelves 104a-104e may temporarily store sealable containers in the buffer system 100.

Figure 1C:
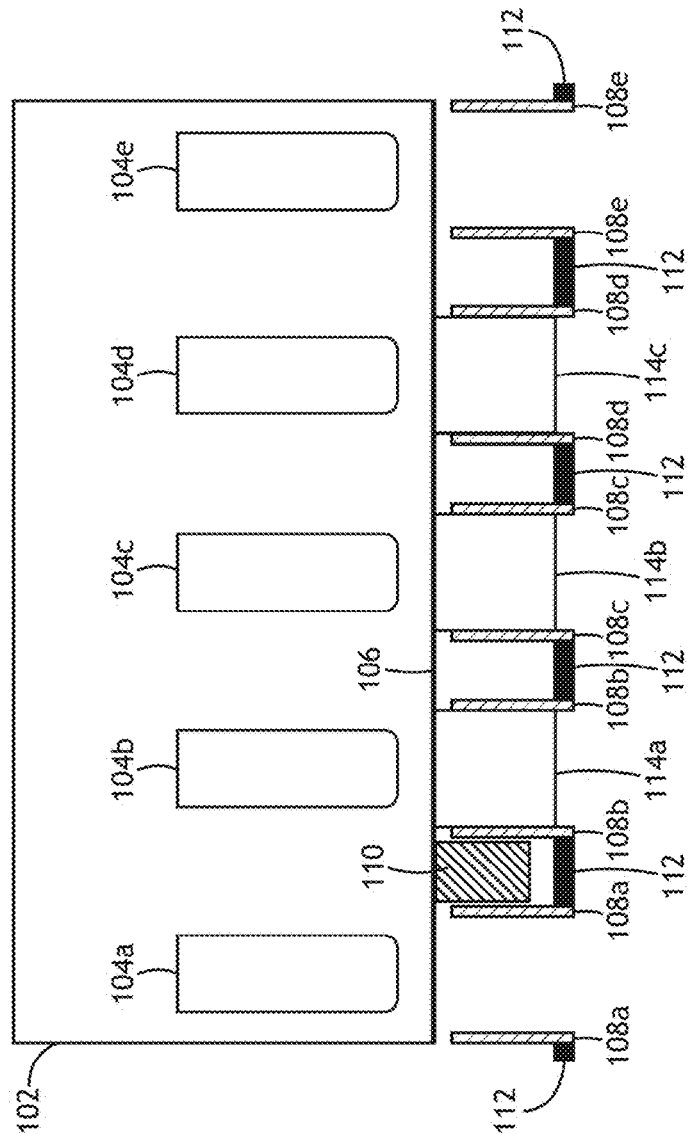
FIG. 1C is a simplified top view of a high-throughput buffer system associated with a semiconductor device fabrication line tool in which retractable shelves are engaged in a retracted position, in accordance with one or more embodiments of the present disclosure.
Figure 1D:
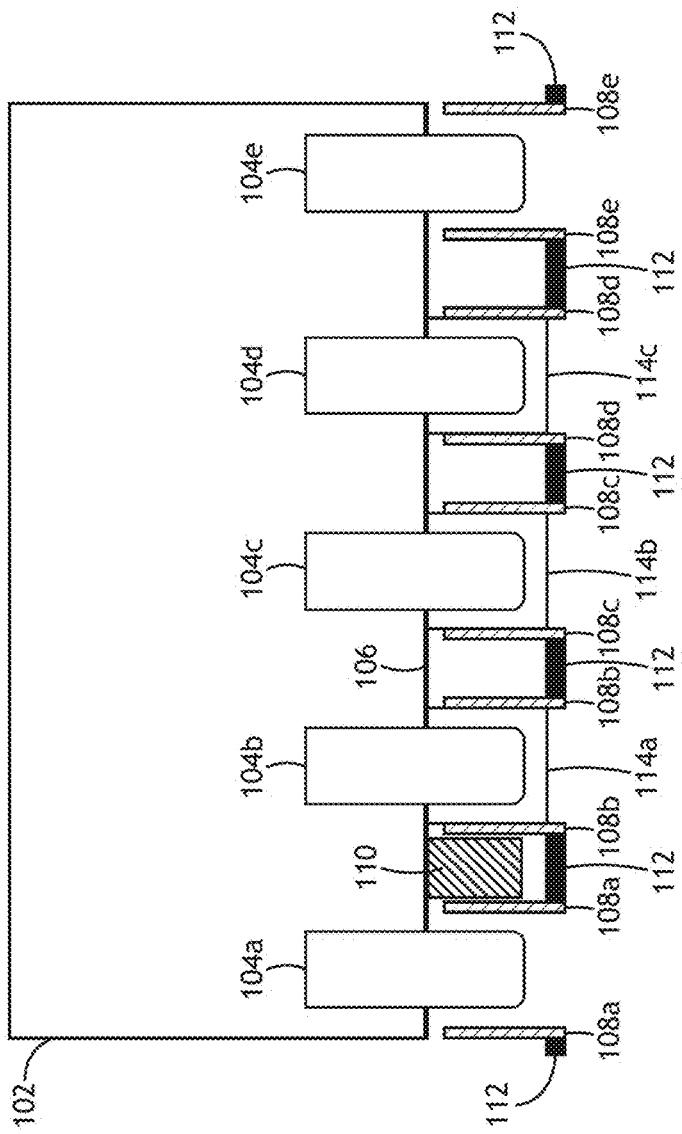
FIG. 1D is a simplified top view of a high-throughput buffer system associated with a semiconductor device fabrication line tool in which retractable shelves are engaged in an extended position, in accordance with one or more embodiments of the present disclosure.

Retractable shelves may be located at any position within the buffer system 100 including, but not limited to, locations above, below, or adjacent to load ports of an associated semiconductor device fabrication tool. In one embodiment, one or more retractable shelves are located at a higher elevation than associated load ports to facilitate efficient access to an external handling system. For example, retractable shelves located at a higher elevation than associated load ports reduce the transport distance to an AMHS, which may decrease delivery times and improve the efficiency of the process flow. In another embodiment, a retractable shelf is positioned directly above each load port (e.g. retractable shelves 104b-104d are positioned above load ports 114a-114c in FIG. 1A) such that a sealable container located on a retractable shelf 104b-104d engaged in an extended position is positioned directly above a load port 114a-114c. FIGS. 1C and 1D are simplified schematic views illustrating a high throughput buffer system 100 in which retractable shelves are retracted and extended, respectively, in accordance with one or more embodiments of the present disclosure. In this regard, a sealable container located on a retractable shelf 104b-104d in an extended position may be transported to a load port 114a-114c via a linear vertical path. It is noted herein that linear vertical transport of a sealable container from a retractable shelf 104b-104d to a load port 114a-114c may be accomplished quickly to minimize delay associated with an external handling system unloading a sealable container onto a retractable shelf 104b-104d instead of directly onto a load port 114a-114c. In another embodiment, a sealable container may be unloaded directly onto a load port 114a-114c by retracting any retractable shelves 104b-104d located above the load port 114a-114c. It is noted herein that the buffer system may include any number of retractable shelves. In this regard, a buffer system may include a single retractable shelf, two retractable shelves, or a multitude of retractable shelves.

Figure 2:
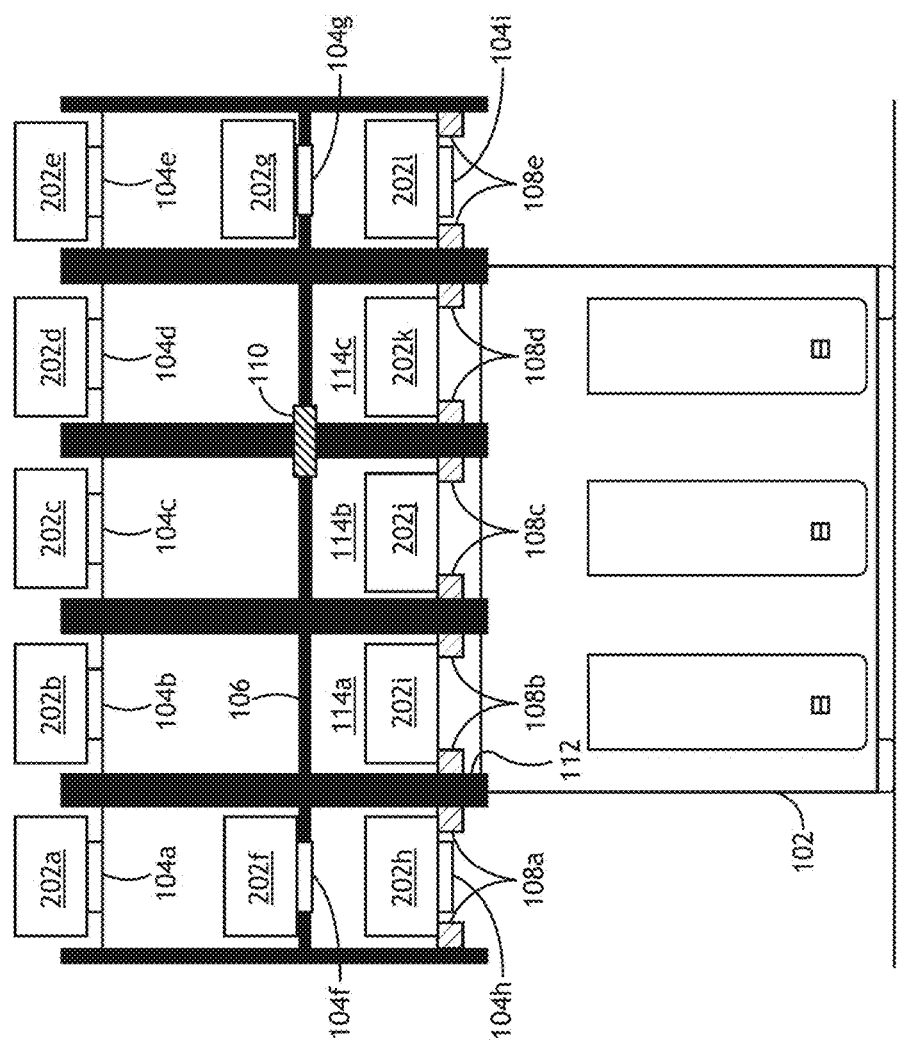
FIG. 2 is a simplified front view of a high-throughput buffer system associated with a semiconductor device fabrication line tool in which sealable containers are located on retractable shelves, in accordance with one or more embodiments of the present disclosure.

In another embodiment, retractable shelves 104a-104i are positioned along vertical columns adjacent to load ports 114a-114c. FIG. 2 is a simplified front view of a high-throughput buffer system illustrating a buffer system containing twelve sealable containers 202a-202l, in accordance with one or more embodiments of the present disclosure. In another embodiment, retractable shelves 104a-104i are positioned along vertical columns adjacent to load ports 114a-114c. Retractable shelves 104a, 104f, and 104h are positioned in a vertical column adjacent to load port 114a, and retractable shelves 104e, 104g, and 104i are located in a vertical column adjacent to load port 114c. It is noted herein that any number of retractable shelves 104a-104i may be located in vertical columns adjacent to load ports 114a-114c.

It is further noted herein that the above descriptions of vertical columns of storage shelves (e.g. retractable shelves 104a-104i) as adjacent to load ports 114a-114c is provided merely for illustrative purposes and should not be interpreted as limiting. For example, vertical columns containing storage shelves may be separated from and/or rotated with respect to load ports 114a-114c.

Retractable shelves 104a-104i may be of any type known in the art. For example, retractable shelves 104a-104i may move along linear paths or rotational paths. In one embodiment, retractable shelves 104a-104i consist of a plate mounted on a linear rail. Motion of a retractable shelf 104a-104i may be driven by, but is not limited to, a leadscrew, a belt drive, a tape drive, a cable drive, or a linear motor.

Referring again to FIGS. 1A-1D, in another embodiment, the buffer system 100 includes lifting assemblies 108a-108e to transport sealable containers vertically. In another embodiment, the buffer system 100 includes a lifting assembly associated with each retractable shelf for vertical transport of sealable containers to and from retractable shelves (e.g. to and from retractable shelves 104a-104e). In another embodiment, lifting assemblies 108b-108d are associated with load ports 114a-114c. In this regard, a lifting assembly 108b-108d may transport a sealable container up or down between a load port 114a-114c and a retractable shelf 104b-104d positioned directly above the load port 114a-114c. In one embodiment, a retractable shelf 104b-104d retracts to provide clearance for a sealable container transported by a lifting assembly 108a-108e. For example, a sealable container located on a retractable shelf 104b-104d engaged in an extended position may be transported by a lifting assembly 108b-108d by first lifting the sealable container from the retractable shelf 104b-104d, retracting the retractable shelf 104b-104d, and vertically transporting the sealable container to a loading port. A similar sequence of steps may be utilized to perform the reverse operation of transporting a sealable container from a load port 114a-114c to a retractable shelf 104b-104d. Further, retractable shelves in vertical columns adjacent to load ports (e.g. 104a, 104e) retract to provide clearance for transport of sealable containers by lifting assemblies (e.g. 108a, 108e). In another embodiment, a lifting assembly 108a-108e may transport a sealable container to any intermediate position along a travel path of the lifting assembly 108a-108e.

The lifting assemblies 108a-108e may be of any type known in the art suitable for transporting sealable containers. In one embodiment, a lifting assembly (e.g. any of 108a-108e) contains a fork including any number of prongs for lifting a sealable container from a bottom side. In another embodiment, a lifting assembly contains a fork with two prongs. In another embodiment, lifting assemblies 108a-108e travel along one or more linear rail assemblies 112. Further, the motion of a lifting assembly 108a-108e may be driven by, but is not limited to, a cable drive, a tape drive, or a counter weight. It is noted herein that the buffer system may include any number of lifting assemblies. In this regard, a buffer system may include a single lifting assembly, two lifting assemblies, or a multitude of lifting assemblies.

In another embodiment, the buffer system 100 includes a sliding assembly 106 to transport sealable containers horizontally. In one embodiment, at least a portion of the sliding assembly 106 is positionable below retractable shelves 104a-104e and above load ports 114a-114c. In this regard, lifting assemblies 108a-108e may transfer sealable containers from retractable shelves 104a-104e or load ports 114a-114c to a sliding assembly 106. Further, a sliding assembly 106 may transport sealable containers to one or more positions beneath any of the retractable shelves 104a-104e, or alternatively, to one or more positions above any of the load ports 114a-114c. In one embodiment, a sliding assembly 106 transports a sliding container to a position aligned with any of the retractable shelves 104a-104e or any of the load ports 114a-114c. For example, considering FIG. 1A, a sealable container on a load port 114b may be transported to a retractable shelf 104a not directly above the load port 114a via vertical transport by lifting assembly 108c to the sliding assembly 106, followed by horizontal transport by the sliding assembly 106 to a position beneath the retractable shelf 104a, and further followed by vertical transport to retractable shelf 104a via lifting assembly 108a.

A buffer system 100 may include any number of sliding assemblies 106 for horizontal transport of sealable containers. In this regard, a buffer system may include a single sliding assembly, two sliding assemblies, or a multitude of sliding assemblies. For example, multiple sliding assemblies may be arranged vertically between retractable shelves 104a-104e and load ports 114a-114c. In this regard, each sliding assembly (e.g. 106) may horizontally transport sealable containers at a given elevation within the buffer system 100. In another embodiment, one or more sliding assemblies 106 are located below one or more load ports 114a-114c.

Sliding assembly 106 may be of any type known in the art suitable for transporting sealable containers. In one embodiment, a sliding assembly 106 includes a plate 110 to support a sealable container from a bottom side travelling along a rail. Motion of a sliding assembly 106 may be driven by, but is not limited to, a leadscrew, a belt drive, a tape drive, a cable drive, or a linear motor. In one embodiment, sliding assemblies 106 are mountable to a front side of the semiconductor device fabrication line tool 102 in a cantilevered configuration. In another embodiment, sliding assemblies 106 are mountable on a portion of the floor proximate to the semiconductor device fabrication line tool 102.

To facilitate safety, all moving parts of the buffer assembly may include safety stops to prevent damage to any person or component including, but not limited to, the buffer system 100, the semiconductor device fabrication line tool 102, the sealable container or the contents within, operations and maintenance personnel, or an external system. In one embodiment, lift systems 108a-108e include breaks configured to lock the sealable container in place to prevent a fall in the case of mechanical failure. The sealable container could then be either manually retrieved by a technician or an external handling system. In another embodiment, the transfer assemblies 106 include shields or stops to prevent motion beyond defined limits. Additionally, a buffer system 100 may include safety interlocks. For example, motion of components such as, but not limited to retractable shelves, lifting assemblies, or sliding assemblies may be stopped, limited or otherwise restricted upon interruption of an interlock. As another example, power to at least a portion of a buffer system 100 or a fabrication line tool 102 may be disconnected upon interruption of an interlock.

FIG. 3 is a schematic view illustrating a bottom side 302 of a sealable container, in accordance with one or more embodiments of the present disclosure. It is noted herein that many automatic material handling systems transport sealable containers between semiconductor device fabrication line tools 102 by lifting a top handle on the sealable container. However, supporting a sealable container from a top handle for an extended period of time may cause the sealable container to deform, and, in turn, negatively impact the pressure of the interior of the sealable container. Negative pressure on the interior of a sealable container with respect to exterior pressure may result in the introduction of contaminants. Further, a malfunction of a gripping mechanism designed to support a sealable container from a top handle may result in a drop of the sealable container and catastrophic damage of the contents within.

In one embodiment, sealable containers are continually supported on a bottom side during storage and transport. Components of the buffer system 100 may transfer support of a sealable container while maintaining bottom-side support of the sealable container by any procedure known in the art. For example, bottom-side support of a sealable container may be maintained during transfer between two components of the buffer system 100 in which the two components of the buffer system 100 support complementary portions of the bottom side of the sealable container. Referring again to FIG. 1A-1D, in one embodiment, the widths of retractable shelves 104a-104e are narrower than the widths of sealable containers such that a portion of the bottom sides of sealable containers extend beyond the retractable shelves 104a-104e. Further, lifting assemblies 108a-108e contain forks with two prongs separated by at least the widths of retractable shelves 104a-104e. In this regard, a lifting assembly 108a-108e may lift a sealable container from a retractable shelf 104a-104e through simple vertical translation past the elevation of the retractable shelf 104a-104e. In another embodiment, lifting assemblies 108a-108e contain forks with three prongs and retractable shelves 104a-104e contain complementary notches. In an further embodiment, lifting assemblies 108a-108e contain one or more features oriented to pass between complementary openings on the retractable shelves 104a-104e such that bottom-side support of sealable containers is maintained during transfer. In another embodiment, plates 110 associated with sliding assemblies 106 and docks of load ports 114a-114c similarly support portions of bottom sides of sealable containers such that the sealable containers may be similarly transferred to and from lifting assemblies 108a-108e via simple vertical translation. In another embodiment, lifting assemblies 108a-108e support side conveyor rails 306 mounted to the sides of the sealable containers. In a further embodiment, lifting assemblies 108a-108e support a conveyor plate (not shown) mounted to the bottom of the sealable containers. It is noted herein that conveyor rails 306 or a conveyor plate (not shown) may operate as support points for transport by external handling systems.

In another embodiment, sealable containers are aligned within a buffer system 100 via kinematic pins that correspond to kinematic pin slots on the bottom side of sealable containers. In one embodiment, three kinematic pin slots 304a-304c connect to corresponding kinematic pins on components within the buffer system 100 to provide stable contact to limit six degrees of freedom to securely position a sealable container. For example, any or all of the retractable shelves 104a-104e, plates 110 associated with sliding assemblies 106, or loading ports 114a-114c may contain kinematic pins or kinematic slots for alignment of sealable containers. It is noted herein that kinematic pin alignment of sealable containers may provide accurate alignment as well as stability during transport. Specifically, kinematic pins may prevent a sealable container from slipping during horizontal or vertical transport in the buffer system 100. It is noted herein, however, that the illustration of kinematic pin slots in FIG. 3 is presented merely for illustration and should not be interpreted as limiting. A component of the buffer system 100 may contain any number or configuration of kinematic pins or kinematic pin slots suitable for kinematic alignment of a sealable container. Further, sealable containers may be transferred using primary or secondary kinematic pins. In another embodiment, sealable containers are transferred using a second set of kinematic pins into the same kinematic slot on the bottom side of the sealable container.

Referring again to FIG. 2, each retractable shelf 104a-104i may interface with an external handling system by as an input port to receive sealable containers containing wafers to be processed by the semiconductor device fabrication line tool or as an output port to support sealable containers containing wafers processed by the semiconductor device fabrication line tool. In one embodiment, vertical columns of retractable shelves 104a, 104f, 104h and 104e, 104g, 104i serve as dedicated input and/or output columns. For example, retractable shelves 104a-104d may be configured as input ports to facilitate rapid transfer to load ports 114a-114c. Further, retractable shelves 104a, 104f, 104h and 104e, 104g, 104i may be configured as output ports. In this regard, the specific number of columns and their use may be determined by the material flow needs of the tool.

In another embodiment, each retractable shelf 104a-104i dynamically operates as an input or output port as necessary. For example, each retractable shelf 104a-104i may independently operate as an input port or an output port. Further, an external handling system may access a sealable container located on a given retractable shelf 104a-104i by retracting all retractable shelves at higher elevations than the given retractable shelf 104a-104i. In another embodiment, retractable shelves 104a-104i are configured to support a sealable container in an extended position, in a retracted position, and while extending and/or retracting. Retractable shelves 104a-104i configured to support sealable containers in any position may be particularly beneficial in columns adjacent to load ports 114a-114c for which clearance on a side of the semiconductor device fabrication line tool 102 may be available. In another embodiment, any of retractable shelves 104a-104i is utilized to transfer a sealable container to a second proximate buffer system.

Figure 4C:
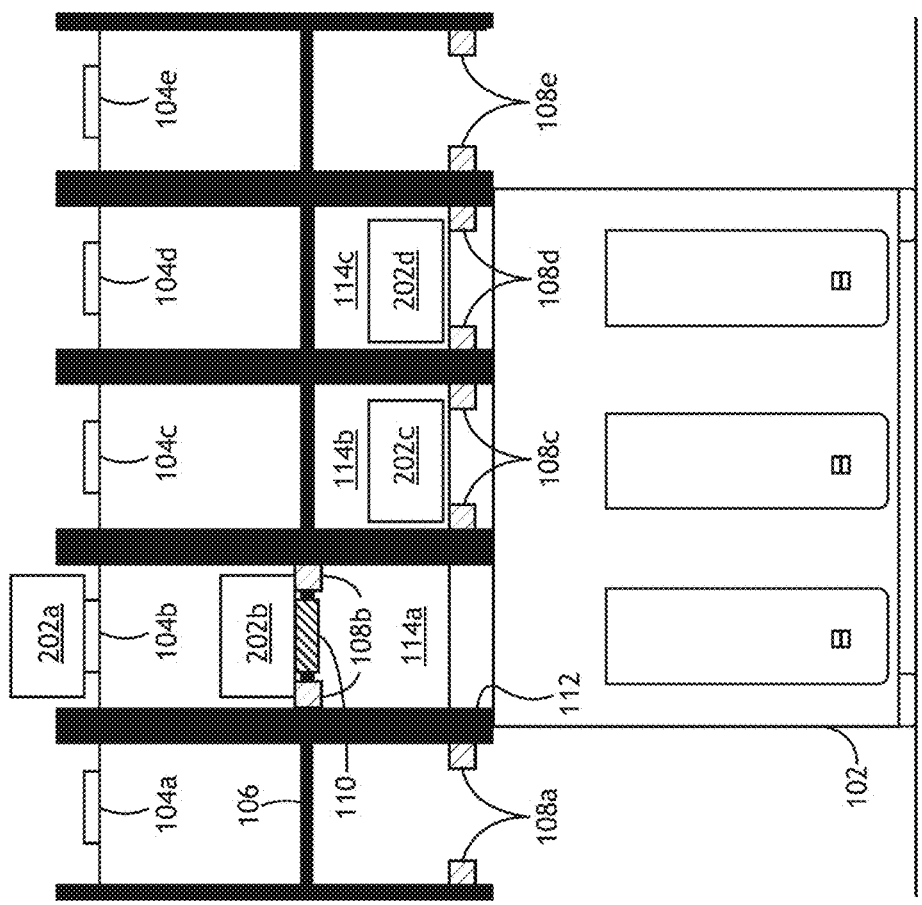
FIG. 4C is a simplified front view of a high-throughput buffer system associated with a semiconductor device fabrication line tool illustrating a sealable container located on a sliding assembly, in accordance with one or more embodiments of the present disclosure.
Figure 4E:
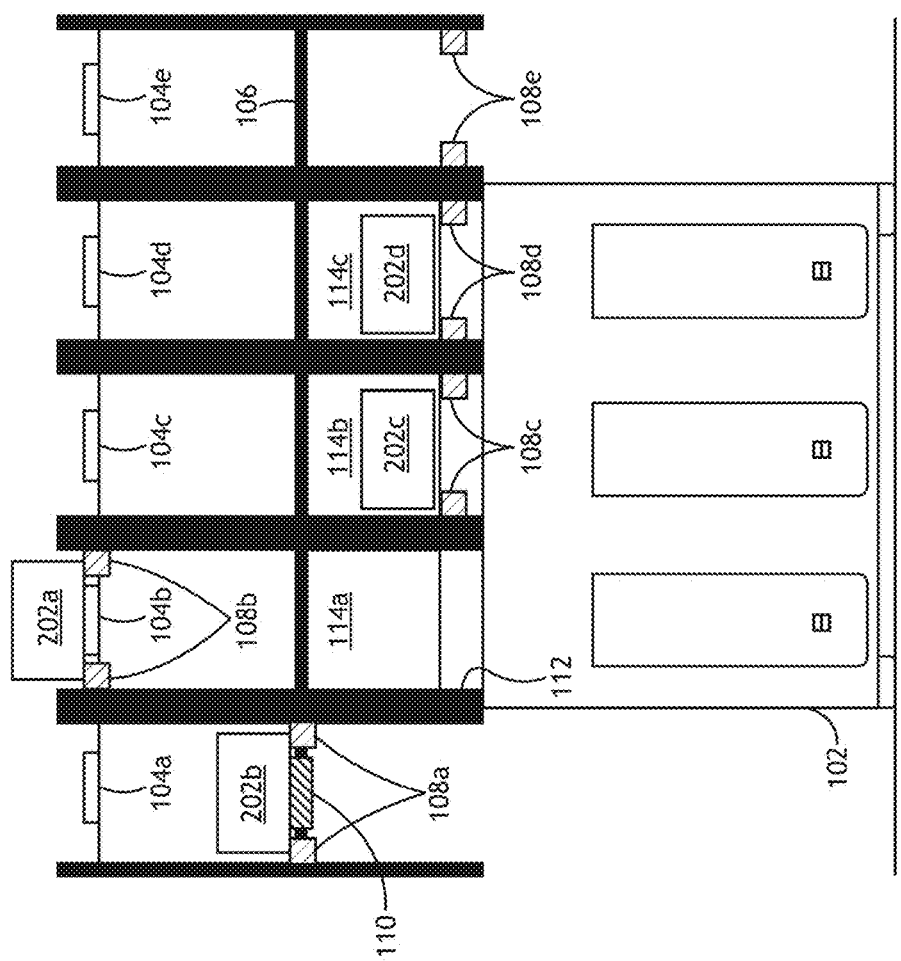
FIG. 4E is a simplified front view of a high-throughput buffer system associated with a semiconductor device fabrication line tool illustrating the transfer of a first sealable container via a sliding assembly and concurrent motion of two lifting assemblies, in accordance with one or more embodiments of the present disclosure.
Figure 4F:
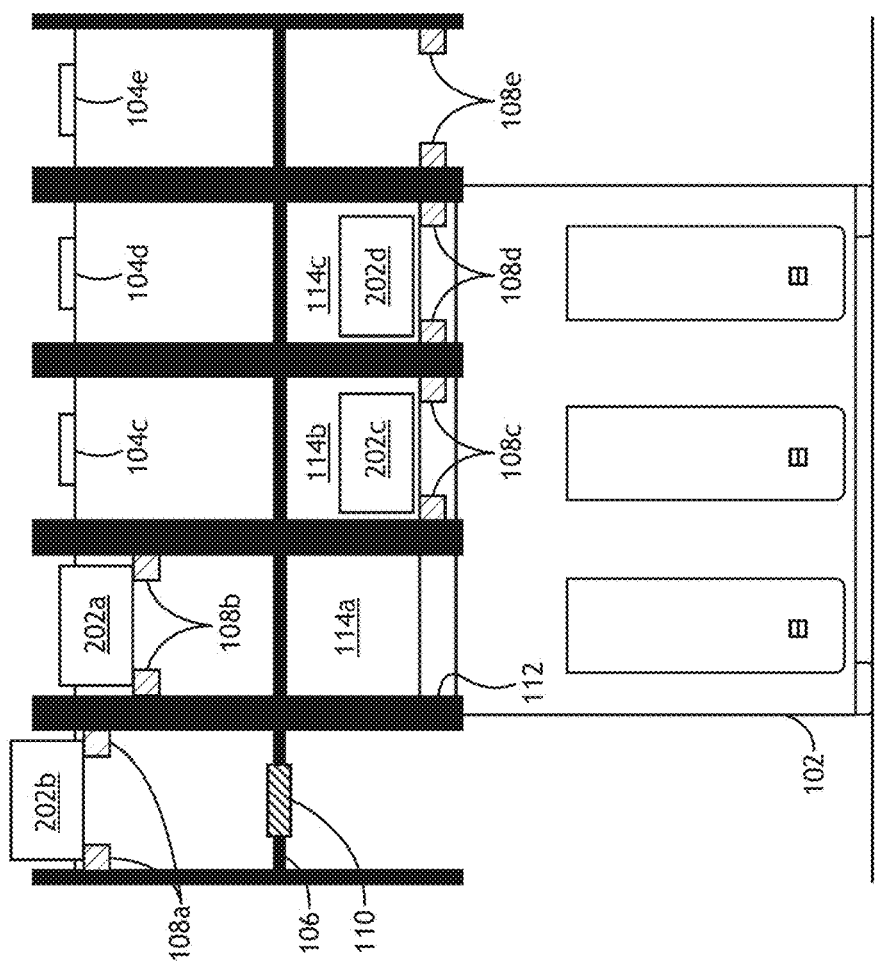
FIG. 4F is a simplified front view of a high-throughput buffer system associated with a semiconductor device fabrication line tool illustrating concurrent motion of retractable shelves retract and motion of lifting assemblies, in accordance with one or more embodiments of the present disclosure.

In another embodiment, all or some components of the buffer system 100 are configured to move concurrently. It is noted herein that concurrent motion of all or some components of the buffer system 100 may provide rapid transport of multiple sealable containers and minimize load requirements on an external handling system. FIGS. 4A-4G illustrate simplified schematic views of a buffer system handling multiple sealable containers via concurrent motion of retractable shelves 104a-104e, a sliding assembly 106, and lifting assemblies 108a-108e, in accordance with one or more embodiments of the present disclosure. FIG. 4A illustrates a state in which three load ports 114a-114c associated with a semiconductor device fabrication line tool 102 are in use by sealable containers 202b-202d, and a queued sealable container 202a is supported on retractable shelf 104b. FIG. 4B illustrates a state in which a semiconductor device fabrication tool 102 has finished processing the contents of sealable container 202b. Lifting assembly 108b lifts sealable container 202b to a position higher than the sliding assembly 106. Concurrently, plate 110 associated with sliding assembly 106 moves from a position beneath retractable shelf 104e to a position beneath retractable shelf 104b. FIG. 4C illustrates a state in which lifting assembly 108b lowers sealable container 202b onto plate 110. FIG. 4D illustrates a state in which lifting assembly 108b continues downward vertical motion to fully disengage with sealable container 202b. FIG. 4E illustrates a state in which sliding assembly 106 transfers sealable container 202b via plate 110 to a position beneath retractable shelf 104a. Concurrently, lifting assembly 108b rises vertically to lift sealable container 202a from retractable shelf 104b. Also concurrently, lifting assembly 108a rises vertically to engage with sealable container 202b. FIG. 4F illustrates a state in which retractable shelves 104a and 104b retract. Concurrently, lifting assembly 108a transports sealable container 202b towards retractable shelf 104a while lifting assembly 108b transports sealable container 202a towards load port 114a. FIG. 4G illustrates a state in which lifting assembly 108b transfers sealable container 202a to load port 114a for processing. Concurrently, retractable shelf 104a extends such that lifting assembly 108a releases sealable container 202b onto retractable shelf 104a. Sealable container 202b is now ready for pickup by an external handling system.

Figure 5A:
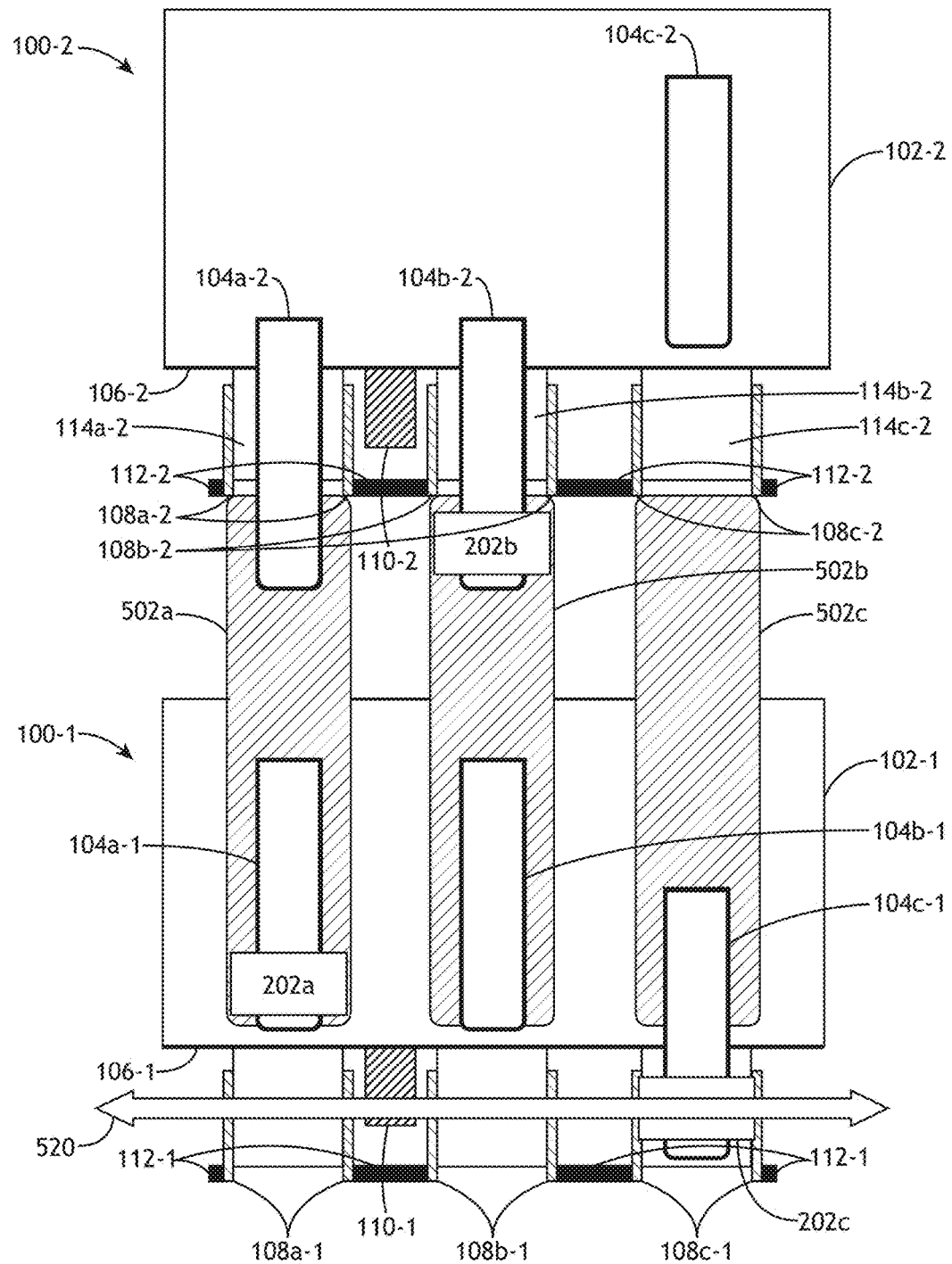
FIG. 5A is a simplified top view of a buffer cluster in which two buffer systems are linked, in accordance with one or more embodiments of the present disclosure.
Figure 5B:
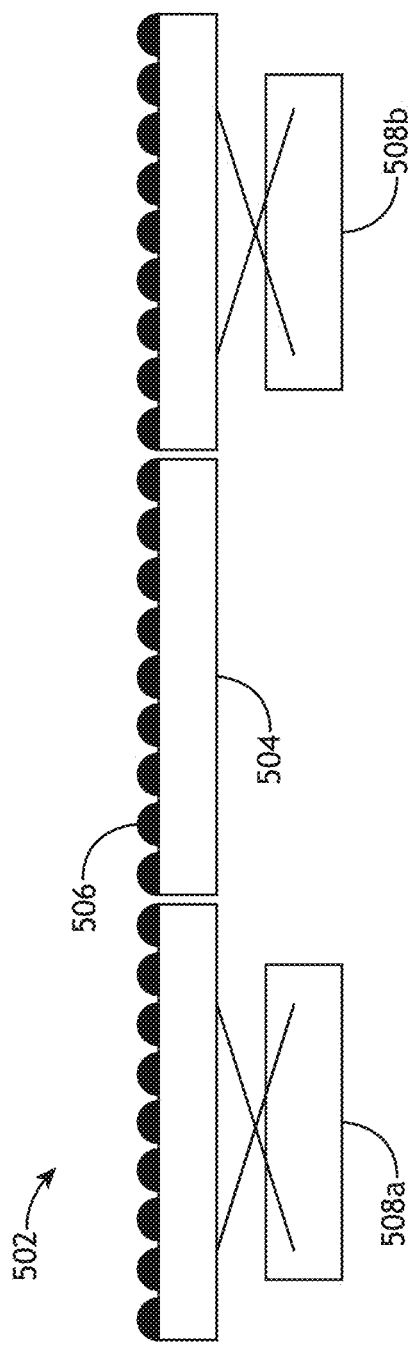
FIG. 5B is a simplified schematic view illustrating a roller assembly for transporting sealable containers between buffer systems, in accordance with one or more embodiments of the present disclosure.

A first buffer system 100 in a fabrication line may transfer a sealable container to a second buffer system 100. Further, any number of buffer systems 100 may be coupled to form a buffer cluster in which sealable containers may transport between buffer systems 100 without an external handling system. FIGS. 5A and 5B are simplified schematic views illustrating a buffer cluster in which two buffer systems are linked, in accordance with one or more embodiments of the present disclosure. FIG. 5A is a simplified schematic view in which a first buffer system 100-1 is linked to a second buffer system 100-2 such that sealable containers transport between the first buffer system 100-1 and the second buffer system 100-2, in accordance with one or more embodiments of the present disclosure. In one embodiment, a first buffer system 100-1 includes retractable shelves 104a-1, 104b-1, 104c-1, sliding assembly 106-1 with a plate 110-1, lifting assemblies 108a-1, 108b-1, 108c-1, and linear rail assembly 112-1. In another embodiment, a second buffer system 100-2 includes retractable shelves 104a-2, 104b-2, 104c-2, sliding assembly 106-2 with a plate 110-2, lifting assemblies 108a-2, 108b-2, 108c-2, and linear rail assembly 112-2. In another embodiment, retractable shelves 104a-1, 104b-1, and 104c-1 associated with a first semiconductor device fabrication line tool 102-1 are coupled to retractable shelves 104a-2, 104b-2, and 104c-2 associated with a second semiconductor device fabrication line tool 102-2 via roller assemblies 502a-502c. FIG. 5B is a simplified schematic view illustrating a roller assembly for transporting sealable containers between buffer systems 100, in accordance with one or more embodiments of the present disclosure. In one embodiment, a roller assembly 502a-502c contains a platform 504 coupled to a series of rollers 506 for transport of a sealable container.

In another embodiment, a roller assembly 502a-502c contains scissor stands 508a, 508b for dynamically adjusting the relative height of each end of the roller assembly 502a-502c. In another embodiment, retractable shelves 104-1 and 104-2 are positioned in notches in roller assemblies 502a-502c. In this regard, a roller assembly (e.g. 502a) may engage with a sealable container (e.g. 202a) located on a retractable shelf (e.g. 104a-1) of a first buffer system 100-1 by extending a first scissor leg 508a higher than a second scissor leg 508b such that rollers 506 support the sealable container (e.g. 202a). Once support of a sealable container transfers to a roller assembly 502, gravitational or motor forces may drive transport of the sealable container (e.g. 202a) to the second buffer system 100-2. In another embodiment, retractable shelves (e.g. 104a-2, 104b-2, 104c-2) associated with a buffer system 100-2 extend beyond a position directly above a load port 114a-2, 114b-2, or 114c-2 to receive a sealable container from a roller assembly 502a-502c. For example, FIG. 5A illustrates a sealable container 202a located on a retractable shelf 104a-1 in a position prepared for transfer to buffer system 100-2. Further, FIG. 5A illustrates a sealable container 202b received from retractable shelf 104b-1. Sealable containers may be similarly transported from buffer system 100-2 to buffer system 100-1.

It is noted herein that the above descriptions of transport of sealable containers between buffer systems within a buffer cluster is provided merely for illustrative purposes and should not be interpreted as limiting. For example, transport of sealable containers between buffer systems may be accomplished by any transport system known in the art suitable for transport of sealable containers. In one embodiment, sealable containers are transported between buffer systems within a buffer cluster through one or more plates coupled to one or more rail systems. In this regard, one or more plates coupled to one or more rail systems may provide both horizontal and vertical transport of sealable containers between buffer systems. In another embodiment, sealable containers are transported between buffer systems within a buffer cluster via one or more local hoist systems.

In another embodiment, buffer systems 100 within a buffer cluster may access a common external handling system 520 such as, but not limited to, an AMHS. In this regard, a buffer cluster may reduce load on an external handling system 520 by providing direct transport between semiconductor device fabrication line tools 102. For example, FIG. 5A illustrates a sealable container 202c located on retractable shelf 104c-1 provided by external handling system 520. It is noted herein that a buffer cluster may be particularly beneficial for process flows utilizing alternating processing steps between multiple semiconductor device fabrication line tools (e.g. 102-1 and 102-2) by providing direct transport between the semiconductor device fabrication line tools (e.g. 102-1 and 102-2). It is further noted herein that transport of sealable containers between buffer systems 100 in a buffer cluster may be significantly faster than transport by an external handling system.

In one embodiment, the buffer system 100 is directly integrated with a semiconductor device fabrication line tool 102. In this regard, semiconductor device fabrication line tool 102 contains the capabilities of the buffer system 100. Further, direct integration may allow for a common set of software to interface with the processing and buffering operations of the semiconductor device fabrication line tool. In another embodiment, the buffer system 100 is separate from, but attached to, a semiconductor device fabrication line tool 102. In a further embodiment, the buffer system 100 is separately mounted proximate to the semiconductor device fabrication line tool 102.

The buffer system 100 may be integrated with a semiconductor process tool such as, but not limited to, a deposition tool (e.g. a vapor deposition tool, an electrochemical deposition tool, a molecular beam epitaxy (MBE) tool, or an atomic layer deposition tool), a removal tool (e.g. a chemical-mechanical planarization (CMP) tool, a wet etch tool, or a dry etch tool), a lithography tool, an ion implantation tool, or a thermal annealing tool. The buffer system 100 may additionally be integrated with an inspection tool such as, but not limited to a defect detection tool. The buffer system 100 may further be integrated with a metrology tool including, but not limited to an overlay registration tool, an optical critical-dimension (CD) tool, a shape metrology tool, a film thickness characterization tool, a wafer metrology tool, or a topography analysis tool. In a general sense, integration of a buffer system 100 with any type of tool suitable for use in a semiconductor device fabrication line is within the spirit and scope of the present disclosure.

Figure 6:
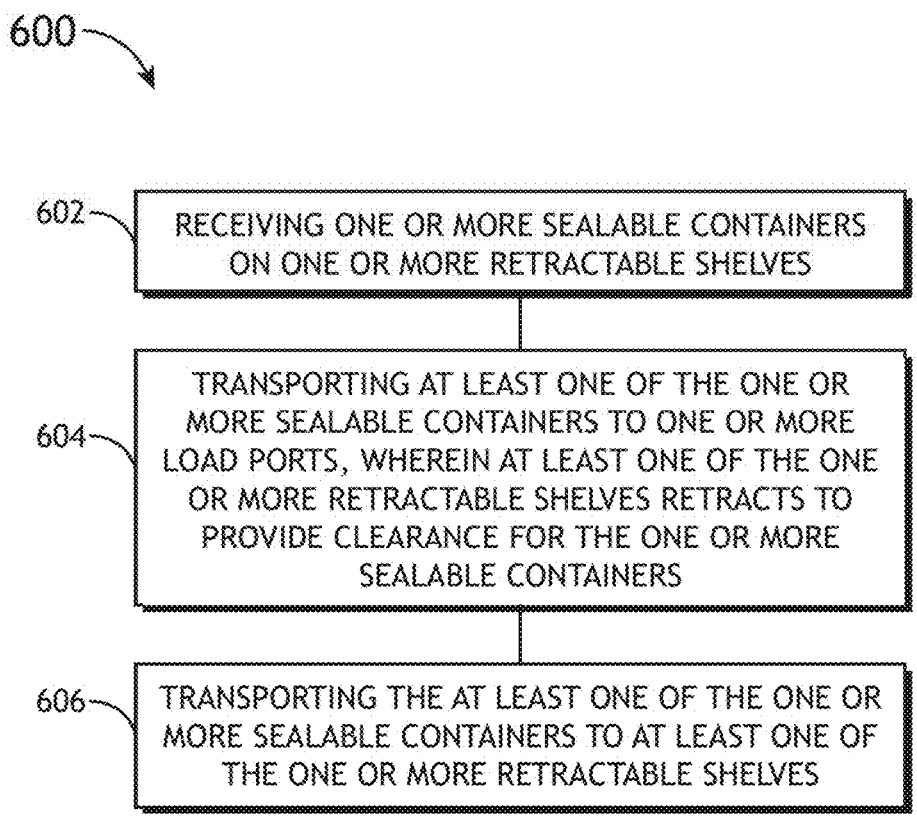
FIG. 6 is a flow diagram illustrating a method for buffering a semiconductor device fabrication line tool, in accordance with one or more embodiments of the present disclosure.

FIG. 6 is a flow diagram illustrating a method 600 for buffering a semiconductor device fabrication line tool, in accordance with one or more embodiments of the present disclosure. Applicant notes that the embodiments and enabling technologies described previously herein in the context of system 100 should be interpreted to extend to method 600. It is further noted, however, that the method 600 is not limited to the architecture of system 100. In step 602, the method includes receiving one or more sealable containers on two or more retractable shelves such that the one or more sealable containers are positioned above one or more load ports. For example, one or more sealable containers may be received by an external handling system such as, but not limited to, an AMHS. In step 604, the method includes transporting at least one of the one or more sealable containers to the one or more load ports. In one embodiment, at least one of the two or more retractable shelves retracts to provide clearance for the one or more sealable containers. In another embodiment, one or more sealable containers are positioned directly above the one or more load ports such that the one or more sealable containers are transported along a linear vertical path to the one or more load ports. In another embodiment, one or more sealable containers are further positioned horizontally shifted with respect to the one or more load ports. For example, a sealable container may be located directly above an occupied load port. As a further example, a sealable container may be located on a retractable shelf not positioned directly above a load port (e.g. any of 104a, 104e, 104h, 104j, or 104m in FIG. 2). In another embodiment, one or more sealable containers are transported along vertical paths using one or more lifting assemblies. In another embodiment, one or more sealable containers are transported along horizontal paths using one or more sliding assemblies. In a further embodiment, one or more sealable containers are transferred between one or more lifting assemblies and one or more sliding assemblies to provide transport to one or more load ports along both vertical and horizontal paths. A sealable container on a load port may be accessed by the semiconductor device fabrication line tool 102 for processing. In step 606, the method includes transporting the at least one of the one or more sealable containers to at least one retractable shelf. Similar to transport to the one or more load ports, a sealable container may be transferred to the at least one retractable shelf via any combination of lifting assemblies and sliding assemblies. A sealable container located on a retractable shelf may be retrieved by the external handling system.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the disclosure is defined by the appended claims.

What is claimed is:

1. A buffer system for a semiconductor device fabrication tool, comprising:
   one or more retractable shelves, wherein the one or more retractable shelves are configured to support sealable containers;
   one or more sliding assemblies positionable above one or more load ports of the semiconductor device fabrication tool, the one or more sliding assemblies including a plate mounted on a linear rail system, the plate configured to support at least a portion of a bottom side of at least one sealable container of the sealable containers when the at least one sealable container is disposed upon the plate, wherein the one or more sliding assemblies are configured to transport the sealable containers to one or more positions beneath the one or more retractable shelves; and
   one or more lifting assemblies, wherein the one or more lifting assemblies are configured to transport the sealable containers between any two of the group including the one or more retractable shelves, the one or more sliding assemblies, and the one or more load ports.

2. The buffer system of claim 1, wherein at least one of the one or more retractable shelves is positionable above at least one of the one or more load ports.

3. The buffer system of claim 1, wherein the one or more retractable shelves comprise:
   two or more retractable shelves, wherein the two or more retractable shelves are aligned in a row.

4. The buffer system of claim 3, wherein the row is oriented horizontally.

5. The buffer system of claim 1, wherein the one or more sliding assemblies transport sealable containers along linear horizontal paths.

6. The buffer system of claim 1, wherein the one or more lifting assemblies support at least a portion of a bottom side of at least one of the sealable containers.

7. The buffer system of claim 1, wherein at least two of the one or more retractable shelves, the one or more sliding assemblies, or the one or more lifting assemblies move concurrently.

8. The buffer system of claim 1, wherein at least one of the one or more retractable shelves retracts to provide clearance for vertical transport of the sealable containers by the one or more lifting assemblies.

9. The buffer system of claim 1, wherein motion of the plate is driven by at least one of a leadscrew, a belt drive, a tape drive, a cable drive, or a linear motor.

10. The buffer system of claim 1, wherein at least one of the one or more retractable shelves or the one or more sliding assemblies includes one or more kinematic pins configured to engage with one or more corresponding slots on the sealable containers to provide flexible alignment of the sealable containers.

11. The buffer system of claim 1, wherein the one or more lifting assemblies transport the sealable containers along linear vertical paths.

12. The buffer system of claim 1, wherein the one or more lifting assemblies support at least one of a conveyor rail or a conveyor plate associated with at least one of the sealable containers.

13. The buffer system of claim 1, wherein motion of at least one of the one or more lifting assemblies is driven by at least one of a cable, a tape, or a counter weight.

14. The buffer system of claim 1, wherein the one or more lifting assemblies comprise:
one or more forks.

15. The buffer system of claim 1, wherein at least one of the one or more lifting assemblies or the one or more sliding assemblies include brakes, wherein the brakes engage upon a drive failure.

16. The buffer system of claim 1, wherein at least one of the one or more retractable shelves, the one or more sliding assemblies, or the one or more lifting assemblies include safety stops to prevent motion beyond a defined limit.

17. The buffer system of claim 1, wherein at least one of the one or more retractable shelves, the one or more sliding assemblies, or the one or more lifting assemblies are integrateable into the semiconductor device fabrication line tool.

18. The buffer system of claim 1, wherein at least one of the one or more retractable shelves, the one or more sliding assemblies, or the one or more lifting assemblies are fixedly attachable to the semiconductor device fabrication line tool.

19. The buffer system of claim 18, wherein at least a portion of the one or more sliding assemblies is mountable to a front side of the semiconductor device fabrication line tool in a cantilevered configuration.

20. The buffer system of claim 1, wherein at least one of the one or more retractable shelves, the one or more sliding assemblies, or the one or more lifting assemblies are positionable proximate to the semiconductor device fabrication line tool.

21. The buffer system of claim 20, wherein the one or more sliding assemblies are mountable to the ceiling.

22. The buffer system of claim 20, wherein the one or more sliding assemblies are mountable to the floor.

23. The buffer system of claim 1, wherein the semiconductor device fabrication line tool comprises:
at least one of a semiconductor process tool, a metrology tool, or an inspection tool.

24. The buffer system of claim 1, further comprising:
one or more roller assemblies configured to transport the sealable containers between the one or more retractable shelves of the buffer system and one or more retractable shelves of a second buffer system.

25. The buffer system of claim 1, wherein the one or more lifting assemblies are further configured to transport the sealable containers to one or more intermediate locations along one or more travel paths associated with the one or more lifting assemblies.

26. A semiconductor device fabrication line tool, comprising:
one or more load ports; and
a buffer sub-system, comprising:
one or more retractable shelves, wherein the one or more retractable shelves are configured to support sealable containers;
one or more sliding assemblies positioned above the one or more load ports, the one or more sliding assemblies including a plate mounted on a linear rail system, the plate configured to support at least a portion of a bottom side of at least one sealable container of the sealable containers when the at least one sealable container is disposed upon the plate, wherein the one or more sliding assemblies are configured to transport the sealable containers to one or more positions beneath the one or more retractable shelves; and
one or more lifting assemblies, wherein the one or more lifting assemblies are configured to transport the sealable containers between any two of the group including the one or more retractable shelves, the one or more sliding assemblies, and the one or more load ports.

27. The semiconductor device fabrication line tool of claim 26, wherein the semiconductor device fabrication line tool comprises:
at least one of a semiconductor process tool, a metrology tool, or an inspection tool.

28. A semiconductor device fabrication line tool, comprising:
one or more load ports, the one or more load ports configured to receive sealable containers; and
a buffer sub-system operatable in an active mode or a passive mode, comprising:
one or more retractable shelves, wherein at least one retractable shelf of the one or more retractable shelves is positionable above a load port of the one or more load ports, wherein the at least one retractable shelf is configured to engage in the retracted position when in the passive mode to provide clearance for transfer of sealable containers between an overhead delivery device and the load port, wherein the at least one retractable shelf is configured to engage in the extended position when in the active mode for transfer of the sealable containers with the overhead deliver device;
one or more sliding assemblies positioned above the one or more load ports, the one or more sliding assemblies including a plate mounted on a linear rail system, the plate configured to support at least a portion of a bottom side of at least one sealable container of the sealable containers when the at least one sealable container is disposed upon the plate, wherein the one or more sliding assemblies are configured to transport the sealable containers to one or more positions beneath the one or more retractable shelves when in the active mode; and
one or more lifting assemblies, wherein the one or more lifting assemblies are configured to transport the sealable containers between any two of a group including the one or more retractable shelves, the one or more sliding assemblies, and the one or more load ports when in the active mode.

29. The semiconductor device fabrication line tool of claim 28, wherein the passive mode is a backup to the active mode.

30. The semiconductor device fabrication line tool of claim 28, wherein the buffer subsystem is configured to dynamically switch between the active mode and the passive mode.

31. The semiconductor device fabrication line tool of claim 28, wherein at least two retractable shelves of the one or more retractable shelves are vertically aligned and positionable at a location adjacent to the one or more load ports.

32. The semiconductor device fabrication line tool of claim 31, wherein a topmost retractable shelf of the at least two retractable shelves is configured for transfer of the sealable containers with the overhead delivery device.

33. The semiconductor device fabrication line tool of claim 32, wherein the buffer sub-system is configured to initiate transfer of the sealable containers between one or more remaining retractable shelves and an additional delivery device.

34. The semiconductor device fabrication line tool of claim 28, wherein at least two retractable shelves of the one or more retractable shelves are vertically aligned and positionable at a location adjacent to the one or more load ports.

35. The semiconductor device fabrication line tool of claim 34, wherein a topmost retractable shelf of the at least two retractable shelves is configured for transfer of the sealable containers with an overhead delivery device.

36. The semiconductor device fabrication line tool of claim 35, wherein the buffer sub-system is configured to initiate transfer of the sealable containers between one or more remaining retractable shelves and an additional delivery device.

* * * * *